United States Patent
Yu et al.

(10) Patent No.: US 8,174,900 B2
(45) Date of Patent: May 8, 2012

(54) WORDLINE VOLTAGE TRANSFER APPARATUS, SYSTEMS, AND METHODS

(75) Inventors: Xiaojun Yu, Beacon, NY (US); Jin-man Han, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 159 days.

(21) Appl. No.: 12/698,833

(22) Filed: Feb. 2, 2010

(65) Prior Publication Data

US 2010/0135084 A1 Jun. 3, 2010

Related U.S. Application Data

(62) Division of application No. 11/702,261, filed on Feb. 5, 2007, now Pat. No. 7,656,740.

(51) Int. Cl.
*G11C 16/06* (2006.01)
(52) U.S. Cl. ............... 365/185.23; 365/51; 365/185.18
(58) Field of Classification Search ............. 365/185.23, 365/185.18, 51
See application file for complete search history.

(56) References Cited

U.S. PATENT DOCUMENTS

| | | | | |
|---|---|---|---|---|
| 5,253,202 | A * | 10/1993 | Bronner et al. | 365/189.011 |
| 5,373,479 | A | 12/1994 | Noda | |
| 5,726,944 | A | 3/1998 | Pelley, III et al. | |
| 5,796,651 | A * | 8/1998 | Horne et al. | 365/156 |
| 6,337,813 | B2 * | 1/2002 | Marr | 365/189.09 |
| 6,370,061 | B1 * | 4/2002 | Yachareni et al. | 365/185.22 |
| 6,735,145 | B1 * | 5/2004 | Atallah et al. | 365/230.06 |
| 7,068,543 | B2 | 6/2006 | Mihnea et al. | |
| 7,120,061 | B2 | 10/2006 | Daga | |
| 7,656,740 | B2 | 2/2010 | Yu et al. | |
| 2008/0186775 | A1 | 8/2008 | Yu et al. | |

* cited by examiner

*Primary Examiner* — Pho M Luu
(74) *Attorney, Agent, or Firm* — Schwegman, Lundberg & Woessner, P.A.

(57) ABSTRACT

The apparatus and systems described herein may comprise a plurality of memory cells coupled to a local wordline, and a wordline drive circuit that includes a regulator coupled to a plurality of pass transistors and a string driver. The regulator may comprise a regulator transistor having a threshold voltage that is substantially the same as the threshold voltage of the string driver during memory cell program operations. In some embodiments, the regulator may comprise a cascode-connected pair of transistors. Methods of manufacturing and operating the apparatus and systems are also described.

20 Claims, 4 Drawing Sheets

WORDLINE VOLTAGE TRANSFER APPARATUS, SYSTEMS, AND METHODS

RELATED APPLICATION

This application is a divisional application of U.S. application Ser. No. 11/702,261 filed on 5 Feb. 2007, now issued as U.S. Pat. No. 7,656,740, which application is incorporated herein by reference in its entirety.

TECHNICAL FIELD

Various embodiments described herein relate to apparatus, systems, and methods associated with information storage and processing, including the operation and manufacture of memories having volatile and non-volatile storage.

BACKGROUND INFORMATION

Continuously reducing the size of solid-state memory architecture is an effective way to increase the capacity of such memories for a given amount of circuit real estate. However, the resulting feature size can give rise to design and process challenges. For example, the programming voltage for individual memory cells in a multi-level cell (MLC) memory architecture is relatively high in order to increase the threshold voltage Vt margin between adjacent levels. However, body bias voltage and physical size differences between pass devices in charge pump regulators coupled to global wordlines and pass devices in local wordline string drivers limit the ability to pass most of the programming voltage to the cells. This limitation tends to extract increased performance from the charge pump, perhaps beyond its design limits.

Several solutions have been attempted. However, simply matching existing device sizes in the regulator and string driver does not rectify the mismatch in a satisfactory manner, due to back-bias differences. The problem may even be enhanced because of the drain-induced-barrier lowering (DIBL) effect. In the end, the regulator device may see higher bias voltages than the string driver device, raising reliability issues.

Another solution is to add a relatively low threshold voltage diode to the regulator. However, this approach also adds voltage overhead, and even if the charge pump size is increased to provide the additional voltage, the mismatch between the global wordline voltage and the local wordline voltage may then exceed the program step voltage, resulting in additional programming pulses. Thus, there is a need for apparatus, systems, and methods that operate to more effectively pass the global wordline programming voltage to local wordlines, without increasing the size of the regulator pump or the pump output voltage magnitude.

DETAILED DESCRIPTION

The challenges described above may be addressed by restructuring wordline drive circuitry to reduce the threshold voltage mismatch between switching devices in the regulator and the string driver. For example, the wordline drive circuit regulator may be constructed to include a regulator transistor that has a threshold voltage (Vt) substantially the same as a threshold voltage (Vt) of the string driver during memory cell program operations. The regulator transistor can be used in addition to the conventional regulator device, perhaps making up one of a pair of cascode-connected transistors.

Figure 1A:
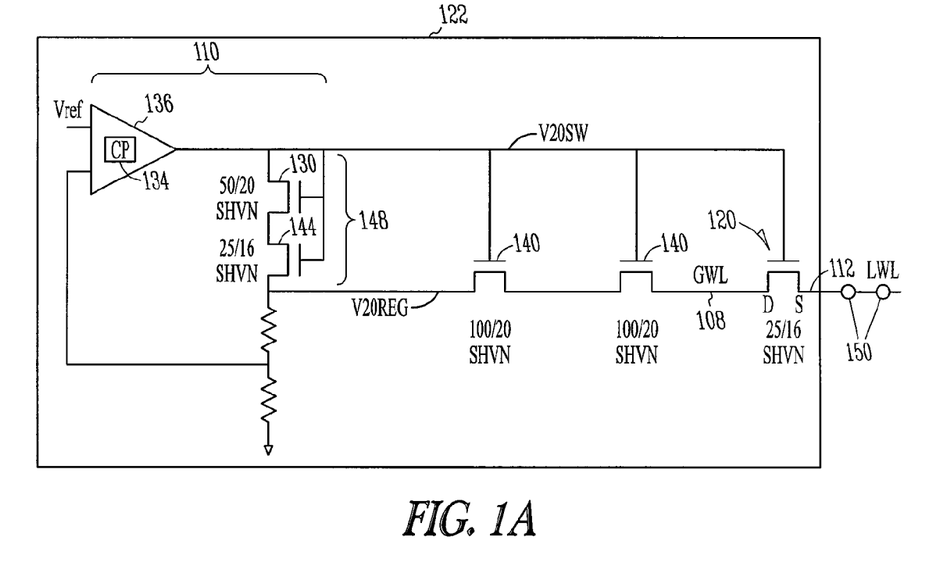
FIG. 1A is a schematic diagram of a wordline drive circuit according to various embodiments of the invention.

FIG. 1A is a schematic diagram of a wordline drive circuit 122 according to various embodiments of the invention. The wordline drive circuit 122 may comprise a regulator 110 that includes a charge pump 134, perhaps combined with a comparator 136. The comparator 136 may include the charge pump 134, or which may be embedded within the charge pump 134. Because the charge pump 134 is limited in the amount of voltage it can produce without weakening, only the voltage needed at the node V20sw to enable proper reading of MLC architectures should be generated. In other words, if 24V is to be supplied to the local word line (LWL) 112, only the voltage needed on the global word line (GWL) 108 to provide 24V on the LWL 112 should be generated, and no more.

The LWL 112 may be coupled to a number of memory cells 150, including a plurality of NAND flash memory cells. Each of the memory cells 150 may include a substrate, a source, a control gate (coupled to the LWL 112), a floating gate electrically isolated by an insulating layer of silicon dioxide $SiO_2$, and a drain. Electrical access to the floating gate takes place through a network of surrounding $SiO_2$ layers, as well as the source, drain, a channel, and the control gate. Charge present on the floating gate is retained due to the energy barrier height of the $SiO_2$, leading to the non-volatile nature of the memory cell.

Programming the memory cell 150 means that charge (i.e., electrons) is added to the floating gate. A high drain to source bias voltage is applied, along with a high control gate voltage. The gate voltage inverts the channel while the drain bias accelerates electrons towards the drain. In the process of crossing the channel, some electrons will experience a collision with the silicon lattice and become redirected towards the $SiO_2$ interface. With the aid of the field produced by the gate voltage, some of these electrons will travel across the oxide and become added to the floating gate. After programming is complete, the electrons added to the floating gate increase the cell's threshold voltage.

Reading a memory cell 150 takes place as follows. For cells that have been programmed, the turn-on voltage of cells is increased by the increased charge on the floating gate. By applying a control gate voltage via an individual local wordline 112 to select a particular cell for reading and monitoring the drain current, differences between cells with charge and cells without charge on their floating gates can be determined. A sense amplifier may be used to compare selected cell drain current with that of a reference cell (typically a flash cell which is programmed to the reference level during manufacturing test). An erased cell should have more cell current than the reference cell and therefore may be read as a logical "1," while a programmed cell should draw less current than the reference cell and may be read as a logical "0." Reading, like programming, is a cell-specific operation.

The LWL 112 threshold voltage Vt may be lower than the GWL 108 threshold voltage Vt due to the size mismatch between the regulator 110 and the string driver 120. For example, conventional regulators often make use of a single regulator device 130 with a relative size ratio of 50/20, whereas the string driver device 120 may have a relative size ratio of 25/16—this size may be maintained to accommodate a narrow pitch, based on a narrow cell width. This narrow width effect accounts for a higher Vt value. The resulting mismatch in threshold voltages means that the voltage at node V20sw must be raised higher to pass the voltage at node V20reg more completely to the LWL 112.

The embodiments described herein provide a new structure for wordline drive circuitry that serves to reduce the threshold voltage mismatch between switching devices in the regulator 110 and the string driver device 120. Essentially, the wordline drive circuit 122 includes a regulator 110 coupled to a plurality of pass transistors 140 and a string driver 120. The regulator 110 comprises a regulator transistor 144 having a threshold voltage (Vt) substantially the same as the threshold voltage (Vt) of the string driver 120 during program operations associated with a plurality of memory cells 150. That is, a substantially equal threshold voltage (Vt) may be associated with at least one of the transistors (e.g., transistor 144) in the regulator 110 and the string driver 120 coupled to the local wordline 112. As shown in FIG. 1A, the regulator device 130 and the regulator transistor 144 may comprise a cascode-connected pair 148 of transistors.

Figure 1B:
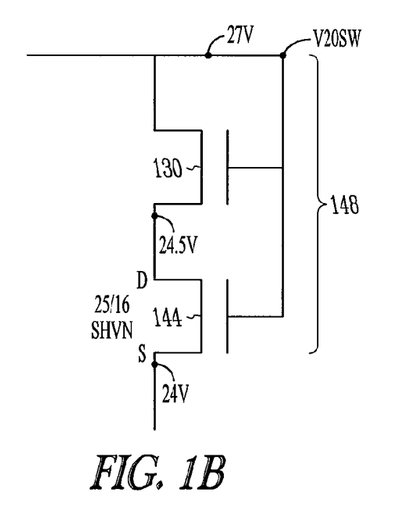
FIG. 1B is a schematic diagram of a cascode-connected pair of regulator transistors according to various embodiments of the invention.

FIG. 1B is a schematic diagram of a cascode-connected pair 148 of regulator transistors according to various embodiments of the invention. The threshold voltage Vt of the pair 148 is substantially determined by the element in the pair 148 that has the higher value of Vt. In other words, since the regulator device 130 has a larger physical size (e.g., 50/20) and higher drain bias (e.g., 27V), it is actually the regulator transistor 144 that has the larger value of Vt for a given difference between the drain-to-source bias voltage. Thus, the threshold voltage Vt of the pair 148 is substantially determined by the regulator transistor 144.

Figure 1C:
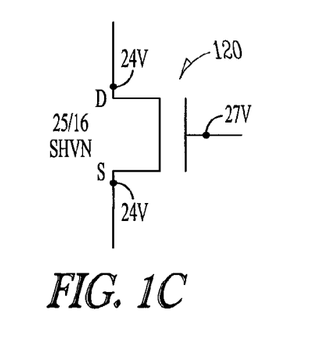
FIG. 1C is a schematic diagram illustrating string driver bias conditions according to various embodiments of the invention.

FIG. 1C is a schematic diagram illustrating string driver 120 bias conditions according to various embodiments of the invention. Referring now to FIGS. 1A, 1B, and 1C, it can be seen that the approach of biasing the regulator transistor 144 to substantially the same conditions as the string driver 120 permits the charge pump 134 to operate so that the node V20sw voltage is raised just high enough to pass the voltage at the node V20reg. In this case, the regulator device 130 operates to drop the voltage supplied at node V20sw from 27V to 24.5V at the drain of the regulator transistor 144, but does not substantially affect the current through the pair 148 (i.e., the regulator device 130 and the regulator transistor 144 may operate using substantially the same drain-to-source current).

In some embodiments, the drain and source of the string driver 120, and the drain and source of the regulator transistor 144 may all operate at substantially the same voltage. Here, "substantially the same voltage" means that the drain and source of the regulator transistor 144 are biased to less than 1V difference from each other, and the drain and source of the string driver 120 are biased to about the same voltages as the drain and source of the regulator transistor 144. Since the regulator transistor 144 and the string driver 120 are of comparable size, they may then also exhibit a comparable threshold voltage Vt. The Vt mismatch between the regulator device 130 and the string driver 120 may thus be reduced from several hundred millivolts, to less than 50 millivolts.

Compared to solutions that involve adding a low-threshold voltage diode to the regulator device 130, for example, the charge pump 134 output voltage in the various embodiments may be sufficient to effectively transfer the wordline voltage at a lower amplitude. That is, using the embodiments described herein, the charge pump 134 voltage output of approximately 27V may be used to generate a LWL 112 voltage of approximately 24V (which is useful when the upper threshold voltage encountered in some MLC cells 150 is about 2.4V), instead of about 28V that might be used in conjunction with an added diode. This difference of one volt in the charge pump output can affect the pump reliability, since 28V may be quite close to the pump's design limit.

Thus, many embodiments may be realized. For example, the wordline drive circuit 122 may include a transistor, such as the regulator transistor 144, that has an area (e.g., 25/16) substantially the same as the area of the string driver 120. The regulator transistor 144 may be included in a cascode-connected pair 148 of transistors, which may in turn comprise a pair of N-type metal oxide semiconductor (NMOS) transistors. Depending on the type of transistors used to fabricate the wordline drive circuit 122, either the source or drain of the regulator transistor 144 may be directly connected to the drain or source, respectively, of one of the plurality of pass transistors 140. The drain-to-source voltage across the regulator transistor 144 may be designed to be less than about a volt when the LWL 112 is selected during the program operations.

Figure 2:
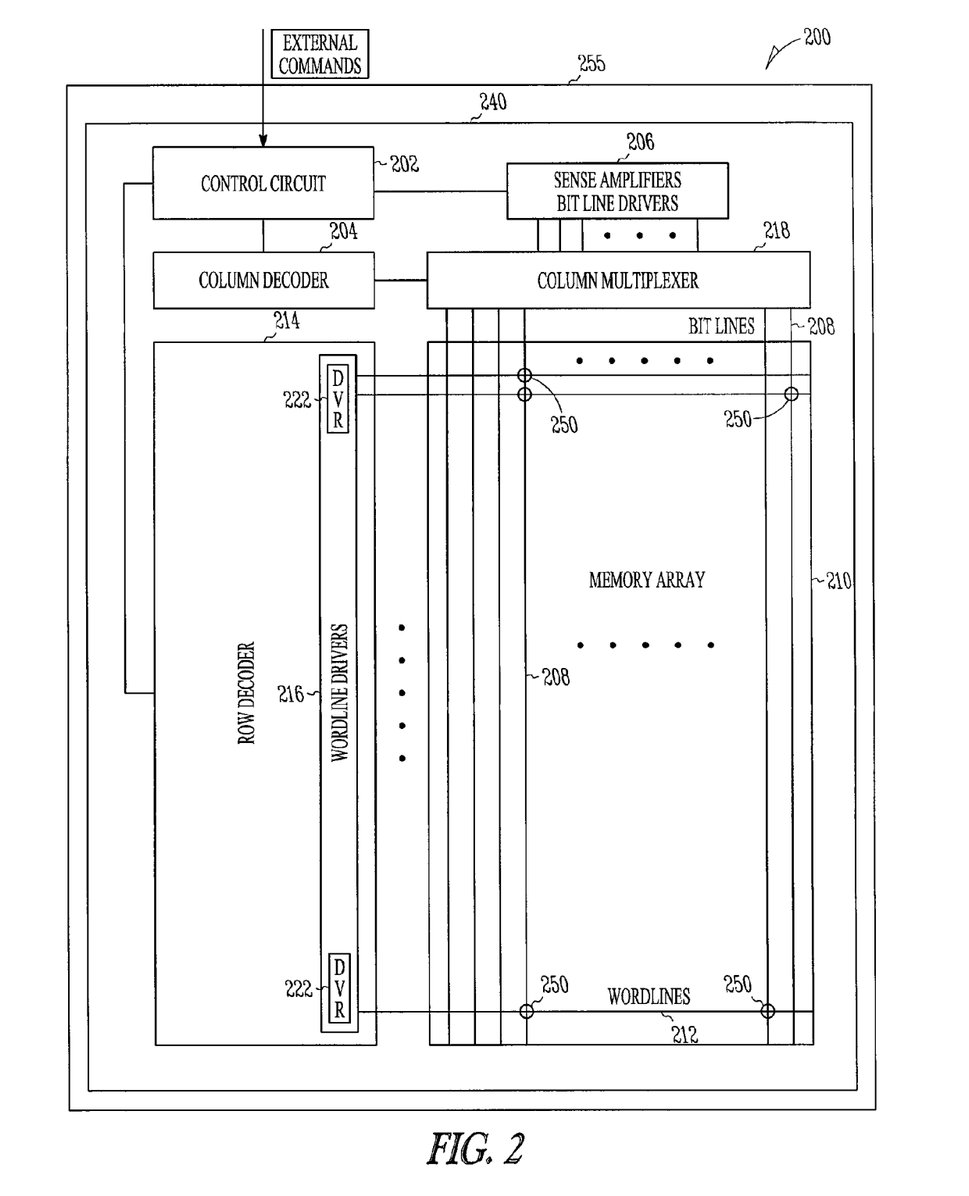
FIG. 2 is a block diagram of an apparatus according to various embodiments of the invention.

FIG. 2 is a block diagram of an apparatus 200 according to various embodiments of the invention. The apparatus 200 may comprise a flash memory that includes a control circuit 202 for controlling the operations of the memory such as reading, writing, and erasing. Thus, the control circuit 202 may receive program commands to initiate programming operations from a processor, for example. The apparatus 200 may also include a column decoder 204, sense amplifiers/bitline drivers 206, bitlines 208, wordlines 212 (similar to or identical to wordlines 112), a row decoder 214 coupled to wordline drivers 216 including wordline drive circuits 222 that can be coupled to the wordlines 212, and a column multiplexer 218. The wordline drive circuits 222 may be similar to or identical to the wordline drive circuit 122 detailed in FIG. 1A, and the GWLs of the wordline drive circuits 222 may be included in the wordline drivers 216.

The apparatus 200 may further comprise a memory array 210 formed on a substrate 240, such as an erasable memory array, including a flash memory array. The apparatus 200 may also comprise a plurality of memory cells 250 (similar to or identical to memory cells 150 shown in FIG. 1A) coupled to the local wordlines 212. The memory cells 250 may comprise NAND flash memory cells so that the memory array 210 comprises a NAND flash memory array.

Referring now to FIGS. 1A and 2, it can be seen that the wordline drive circuit 122 and 222 may include a regulator 110 coupled to a plurality of pass transistors 140 and a string driver 120. The regulator 110 may comprise a regulator transistor 144 having a threshold voltage (Vt) substantially the same as a threshold voltage (Vt) of the string driver 120 during program operations associated with the plurality of memory cells 150 and 250. The apparatus 200 may comprise an integrated circuit package 255 to house the plurality of memory cells 250 and the wordline drive circuits 222.

Thus, some embodiments of the apparatus 200 may include a semiconductor memory comprising an integrated circuit package 255, such as a semiconductor memory package, including a thin small outline package (TSOP), a multi-chip package (MCP), or a package-on-package (PoP), that can be used to house the substrate 240. That is, the substrate 240 and memory array 210 may be disposed within the integrated circuit package 255. Such packages are known to those of ordinary skill in the art, and can be obtained from Micron Technology, Inc.

Figure 3:
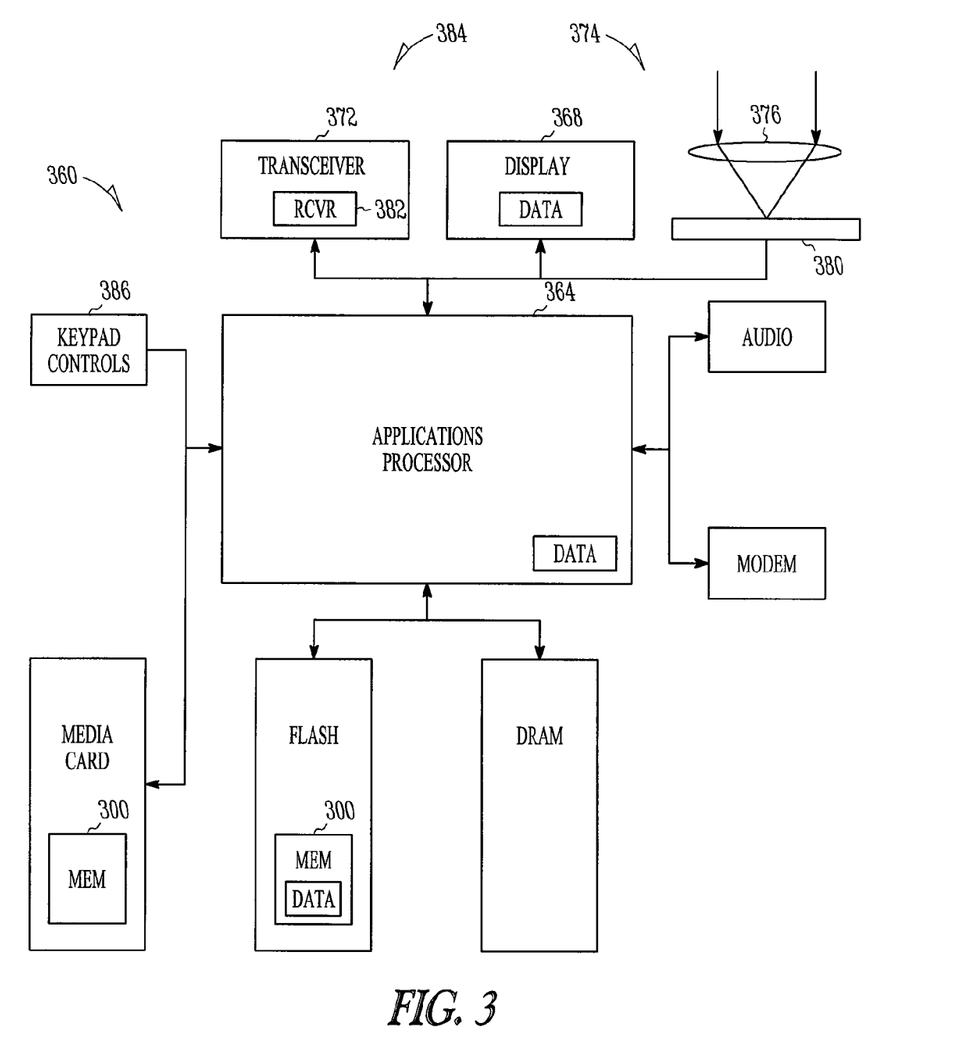
FIG. 3 is a block diagram of a system according to various embodiments of the invention.

FIG. 3 is a block diagram of a system 360 according to various embodiments of the invention. The system 360 may include one or more apparatus 300, which may be similar to or identical to the apparatus 200 shown in FIG. 2.

The system 360, in some embodiments, may comprise a processor 364 coupled to a display 368 and/or a wireless transceiver 372. The memory array(s) included in the apparatus 300, as well as the cells therein, may also be operatively coupled to receive commands from the processor 364, such as program commands to initiate programming operations. Thus, the processor 364 may issue commands, such as program commands, to be received and processed by control circuitry in the apparatus 300. Memory cells storing data in the apparatus 300 may be selected in response to the commands. The display 368 may be used to display data, which may be received by the wireless transceiver 372, and stored in the memory array(s) of the apparatus 300.

In some embodiments, the system 360 may comprise a camera 374, including a lens 376 and an imaging plane 380 to couple to the processor 364. The imaging plane 380 may be used to receive light captured by the lens 376.

Many variations are possible. For example, in some embodiments, the system 360 may comprise a cellular telephone receiver 382 forming a portion of the wireless transceiver 372. The cellular telephone receiver 382 may also receive data to be processed by the processor 364, and displayed on the display 368. In some embodiments, the system 360 may comprise an audio, video, or multi-media player 384, including a set of media playback controls 386 to couple to the processor 364.

Any of the components previously described may be implemented in a number of ways, including embodiments in software. Software embodiments may be used in a simulation system, and the output of such a system may be used to operate various portions of the apparatus 200, 300, and the systems 360 described herein.

Thus, the GWL 108; regulator 110; LWLs 112, 212; string driver 120; wordline drive circuits 122, 222; regulator device 130; charge pump 134, comparator 136; regulator transistor 144; cascode-connected pair 148; memory cells 150, 250; apparatus 200, 300; control circuit 202; column decoder 204; sense amplifiers/bitline drivers 206; bitlines 208; memory array 210; row decoder 214; wordline drivers 216; column multiplexer 218; substrate 240; integrated circuit package 255; systems 360; processor 364; display 368; wireless transceiver 372; camera 374; lens 376; imaging plane 380; cellular telephone receiver 382; multi-media player 384; and media playback controls 386 may all be characterized as "modules" herein.

The modules may include hardware circuitry, optical components, single or multi-processor circuits, memory circuits, software program modules and objects, firmware, and combinations thereof, as desired by the architect of the apparatus 200, 300 and the systems 360, and as appropriate for particular implementations of various embodiments.

The apparatus and systems of various embodiments may be useful in applications other than programming a NAND flash memory array, and thus, the various embodiments are not to be so limited. The illustrations of the apparatus 200, 300 and the systems 360 are intended to provide a general understanding of the structure of various embodiments, and not as a complete description of all the elements and features of apparatus and systems that might make use of the structures described herein.

The novel apparatus and systems of various embodiments may comprise and/or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. Some embodiments may include a number of methods.

Figure 4A:
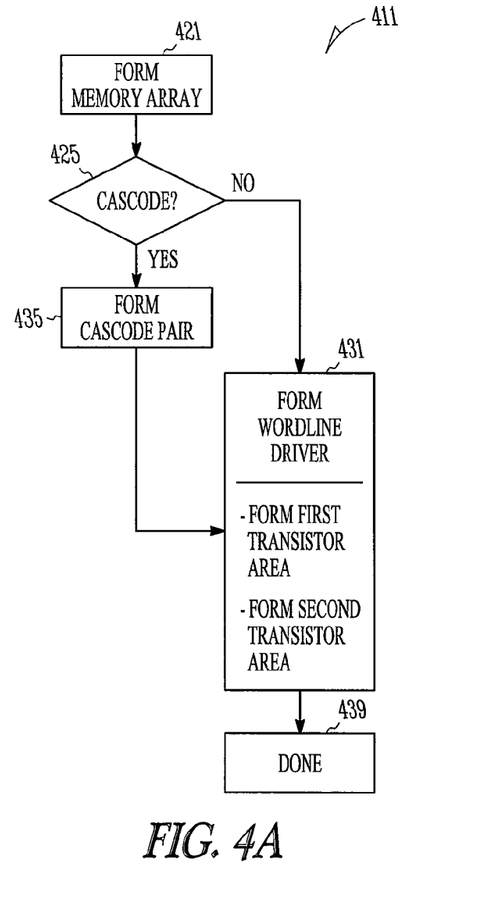
FIGS. 4A and 4B are flow diagrams illustrating several methods according to various embodiments of the invention.
Figure 4B:
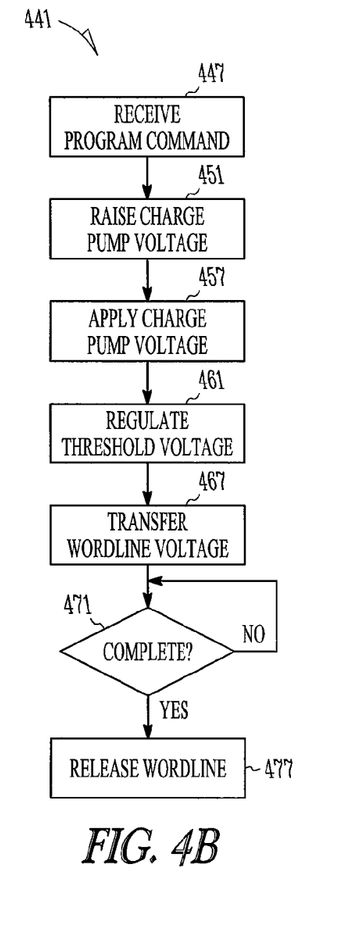

FIGS. 4A and 4B are flow diagrams illustrating several methods 411 and 441, respectively, according to various embodiments of the invention. Referring now to FIG. 4A, it can be seen that in some embodiments, a method 411 may commence with forming a memory array on a substrate with a plurality of memory cells coupled to a local wordline, at block 421.

A wordline drive circuit may be formed to include a regulator comprising a cascode-connected pair of transistors coupled to a plurality of pass transistors and a string driver. Thus, if it is determined at block 425 that the regulator comprises a cascode-connected pair of transistors, then the method 411 may include forming a wordline drive circuit to couple to the local wordline, wherein the wordline drive circuit includes a regulator comprising a cascode-connected pair of transistors coupled to a plurality of pass transistors and a string driver at block 435. The cascode-connected pair may be formed as a pair of NMOS transistors Thus, the method 411 may include forming a wordline drive circuit to couple to the local wordline at block 431, with or without a cascode-connected pair of transistors. The method 411 may include forming a first transistor (perhaps included in the cascode-connected pair) to have an area substantially the same as the area of the string driver. The method 411 may also include forming a second transistor (perhaps included in the cascode-connected pair) to have an area at least 50% greater than the area of the first transistor.

Other embodiments may be realized. For example, referring now to FIG. 4B, it can be seen that a method 441 may comprise receiving a program command at a control circuit coupled to a memory array including a plurality of memory cells coupled to a local wordline, at block 447. The method 441 may proceed with the activities of raising the charge pump voltage to enable a programming operation associated with the plurality of memory cells at block 451, and applying the charge pump voltage to each of the gates of a cascode-connected pair of transistors in a wordline drive circuit coupled to the local wordline at block 457.

In some embodiments, the method 441 may include, at block 461, regulating the threshold voltage of at least one of the transistors in the cascode-connected pair to be substantially the same as the threshold voltage of a string driver coupled to the local wordline. The method 441 may also include transferring a global wordline voltage to the local wordline via the regulator, which may or may not include a cascode-connected pair of transistors, at block 467. The bias conditions of one or more transistors in the cascode-connected pair may be substantially the same as the bias conditions of the string driver coupled to the local wordline. As noted above, the current through each transistor of the cascode-connected pair may be substantially the same during the programming operation.

The method 441 may include waiting, at block 471, to determine if the programming operation is complete. If the programming operation is determined to be complete, the method 441 may include releasing the selected wordline (i.e., turning off the charge pump) at block 477.

It should be noted that the activities described herein may be executed in an order other than the order described. The various activities described with respect to the methods identified herein may also be executed in repetitive, serial, and/or parallel fashion.

A software program may be launched from a computer-readable medium in a computer-based system to execute functions defined in the software program. Various programming languages may be employed to create software programs designed to implement and perform the methods disclosed herein. The programs may be structured in an object-oriented format using an object-oriented language such as Java or C++. Alternatively, the programs may be structured in a procedure-oriented format using a procedural language, such as assembly or C. The software components may communicate using a number of mechanisms well known to those of ordinary skill in the art, such as application program interfaces or inter-process communication techniques, including remote procedure calls. The teachings of various embodiments are not limited to any particular programming language or environment. Thus, other embodiments may be realized.

For example, an article of manufacture, such as a computer, a memory system, a magnetic or optical disk, some other storage device, and/or any type of electronic device or system may include a processor coupled to a machine-accessible medium such as a memory (including the memory array 210 of FIG. 2) having associated information (e.g., computer program instructions and/or data), which, when accessed, results in a machine (e.g., the processor) performing any of the activities described herein with respect to the methods shown in FIG. 4.

The apparatus, systems, and methods disclosed herein may operate to increase charge pump performance in memory array wordline drive circuits without increasing the pump size or capacity. Increased memory device reliability, and operational lifetime, may result.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A semiconductor memory comprising:
   a semiconductor memory package; and
   a substrate disposed within the semiconductor memory package, the substrate comprising a plurality of memory cells coupled to a local wordline and a wordline drive circuit including a regulator coupled to a plurality of pass transistors and a string driver, wherein the regulator comprises a regulator transistor having a threshold voltage (Vt) substantially the same as a threshold voltage (Vt) of the string driver during program operations associated with the plurality of memory cells.

2. The semiconductor memory of claim 1, wherein the plurality of memory cells comprise NAND flash memory cells.

3. The semiconductor memory of claim 1, wherein the regulator comprises a cascade-connected pair of transistors including the regulator transistor.

4. The semiconductor memory of claim 1, further comprising a row decoder coupled to the wordline drive circuit.

5. The semiconductor memory of claim 1, further comprising a control circuit to receive a program command from a processor to initiate the program operations.

6. A semiconductor memory comprising:
   a plurality of memory cells coupled to a local wordline; and
   a wordline drive circuit coupled to the local wordline, wherein the wordline drive circuit comprises a regulator having a cascade-connected pair of transistors coupled to a plurality of pass transistors and a string driver, and wherein the cascade-connected pair of transistors includes a first transistor and a second transistor, the first transistor including a source, and the second transistor including a drain directly coupled to the source of the first transistor.

7. The semiconductor memory of claim 6, wherein an area of one of the transistors in the cascade-connected pair of transistors is substantially the same as an area of the string driver.

8. The semiconductor memory of claim 6, wherein bias conditions of at least one of the transistors in the cascade-connected pair of transistors are substantially the same as bias conditions of the string driver.

9. The semiconductor memory of claim 6, wherein the regulator is configured to transfer a global wordline voltage to the local wordline.

10. The semiconductor memory of claim 6, wherein the regulator is configured to regulate a threshold voltage (Vt) of at least one of the transistors in the cascode-connected pair of transistors to be substantially the same as the threshold voltage (Vt) of the string driver.

11. The-semiconductor memory of claim 6, wherein the plurality of memory cells are included in a NAND flash memory array.

12. The semiconductor memory of claim 6, wherein the cascode-connected pair of transistors comprises a pair of N-type metal oxide semiconductor (NMOS) transistors.

13. The semiconductor memory of claim 6, further comprising:
 a processor to issue a program command, wherein the plurality of memory cells are operatively coupled to be selected in response to the program command issued by the processor; and
 a display to display data processed by the processor.

14. The semiconductor memory of claim 6, further comprising:
 a processor to issue a program command;
 a display to display data processed by the processor; and
 a cellular telephone receiver to receive the data and forming a portion of a wireless transceiver coupled to the processor, wherein the plurality of memory cells are operatively coupled to be selected in response to the program command issued by the processor.

15. The semiconductor memory of claim 14, further comprising set of media playback controls to couple to the processor.

16. A semiconductor memory comprising:
 a plurality of memory cells coupled to a local wordline; and
 a wordline drive circuit coupled to the local wordline, wherein the wordline drive circuit comprises a regulator having a cascode-connected pair of transistors coupled to a plurality of pass transistors and a string driver, wherein an area of one of the transistors in the cascode-connected pair of transistors is substantially the same as an area of the string driver, and wherein the cascode-connected pair of transistors comprises a first transistor and a second transistor, the second transistor having an area at least 50% greater than an area of the first transistor.

17. A semiconductor memory comprising:
 a plurality of memory cells coupled to a local wordline; and
 a wordline drive circuit coupled to the local wordline, wherein the wordline drive circuit comprises a regulator having a cascode-connected pair of transistors coupled to a plurality of pass transistors and a string driver, wherein the regulator is configured to raise a charge pump voltage to enable a programming operation associated with the plurality of memory cells.

18. The semiconductor memory of claim 17, wherein the regulator is configured to apply the charge pump voltage to each gate of the cascode-connected pair of transistors.

19. The semiconductor memory of claim 17, wherein a current through each transistor of the cascode-connected pair of transistors is substantially the same during the programming operation.

20. The semiconductor memory of claim 17, wherein a charge pump is coupled to the regulator and is configured to turn off when the programming operation is completed.

* * * * *

UNITED STATES PATENT AND TRADEMARK OFFICE
CERTIFICATE OF CORRECTION

PATENT NO. : 8,174,900 B2
APPLICATION NO. : 12/698833
DATED : May 8, 2012
INVENTOR(S) : Xiaojun Yu et al.

It is certified that error appears in the above-identified patent and that said Letters Patent is hereby corrected as shown below:

In column 8, line 37, in Claim 3, delete "cascade-connected" and insert
-- cascode-connected --, therefor.

In column 8, line 50, in Claim 6, delete "cascade-connected" and insert
-- cascode-connected --, therefor.

In column 9, line 4, in Claim 11, delete "The-semiconductor" and insert
-- The semiconductor --, therefor.

Signed and Sealed this
Tenth Day of July, 2012

David J. Kappos
*Director of the United States Patent and Trademark Office*